(12) United States Patent
Piatti

(10) Patent No.: US 7,189,092 B2
(45) Date of Patent: Mar. 13, 2007

(54) MODULAR SEMICONDUCTOR PACKAGE TESTING CONTACTOR SYSTEM

(75) Inventor: Lawrence Ercoli Piatti, Dublin, CA (US)

(73) Assignee: Antares conTech, Inc., Gilbert, AZ (US)

( * ) Notice: Subject to any disclaimer, the term of this patent is extended or adjusted under 35 U.S.C. 154(b) by 0 days.

(21) Appl. No.: 11/177,673

(22) Filed: Jul. 8, 2005

(65) Prior Publication Data

US 2006/0051995 A1 Mar. 9, 2006

Related U.S. Application Data

(60) Provisional application No. 60/587,761, filed on Jul. 14, 2004.

(51) Int. Cl.
*H01R 13/62* (2006.01)
(52) U.S. Cl. ........................... 439/330; 324/754
(58) Field of Classification Search ............... 439/70, 439/71, 330, 526; 324/754, 755, 758
See application file for complete search history.

(56) References Cited

U.S. PATENT DOCUMENTS

| | | | |
|---|---|---|---|
| 4,840,576 A | | 6/1989 | Nierescher et al. |
| 5,215,472 A | * | 6/1993 | DelPrete et al. ............... 439/71 |
| 5,493,237 A | * | 2/1996 | Volz et al. .................. 324/754 |
| 5,568,057 A | * | 10/1996 | Kim et al. .................... 324/755 |
| 6,541,991 B1 | * | 4/2003 | Hornchek et al. ........... 324/755 |
| 6,559,665 B1 | * | 5/2003 | Barabi ......................... 324/755 |
| 6,609,923 B2 | * | 8/2003 | Sato et al. ................... 439/259 |
| 6,707,309 B2 | * | 3/2004 | Sato et al. ................... 324/755 |
| 6,929,505 B2 | * | 8/2005 | He et al. ...................... 439/526 |
| 2004/0014346 A1 | | 1/2004 | Azumi |

FOREIGN PATENT DOCUMENTS

WO WO 00/18204 3/2000

OTHER PUBLICATIONS

International Search Report for PCT International Application PCT/US2005/024492 mailed Nov. 17, 2005.

* cited by examiner

*Primary Examiner*—Thanh-Tam Le
(74) *Attorney, Agent, or Firm*—Snell & Wilmer L.L.P.

(57) ABSTRACT

An interconnect mechanism for providing electrical interconnection between a device under test and a tester includes a base having a first side and a second side. The base defines a plurality of apertures extending from the first side to the second side. The first side of the base is configured to receive the device under test. The interconnect mechanism also includes a plurality of alignment mechanisms configured to be detachably coupled to the first side of the base. The plurality of alignment mechanisms define an area of the first side of the base to receive the device under test when the plurality of alignment mechanisms are coupled to the first side of the base. Each of the plurality of alignment mechanisms includes an adjustment mechanism for adjusting the area of the first side of the base defined by the plurality of alignment mechanisms.

15 Claims, 8 Drawing Sheets

200~# MODULAR SEMICONDUCTOR PACKAGE TESTING CONTACTOR SYSTEM

CROSS REFERENCE TO RELATED APPLICATIONS

This application claims the benefit of priority to U.S. Provisional Patent Application No. 60/587,761, filed on Jul. 14, 2004, the contents of which are incorporated herein by reference.

FIELD OF THE INVENTION

The present invention relates to semiconductor device testing, and more particularly, to manual and/or automated package testing environments in the semiconductor industry.

BACKGROUND OF THE INVENTION

In the testing of packaged integrated circuits (i.e., ICs) an interface is typically provided between a tester/testing system and a device under test. Such an interface typically includes electrical connection points, where electrical contacts of the device under test contact one side of the interface, and electrical contacts of the tester electrically contact the other side of the interface.

Because of the wide spectrum of ICs that are tested, a corresponding spectrum of such interface devices are available. For example, the size differences among ICs may result in a variety of interfaces that accommodate the varying sized ICs.

Typically, if a user desires to test a new or different IC, the user obtains a interface appropriate for the IC. In package testing, most such interfaces typically are molded plastic (e.g., injection molded), and are molded to accommodate the specific size and configuration of the subject IC; however, the time required to design and manufacture such an interface may be undesirable, particularly in view of the rapid pace of the semiconductor industry. Further, requisitioning an interface to test each different IC may result in a substantial and undesirable cost to the user.

Thus, it would be desirable to provide an interconnect mechanism that overcomes one or more of the above-recited deficiencies of prior interface devices.

SUMMARY OF THE INVENTION

According to an exemplary embodiment of the present invention, an interconnect mechanism for providing electrical interconnection between a device under test and a tester is provided. The interconnect mechanism includes a base having a first side and a second side. The base defines a plurality of apertures extending from the first side to the second side. The first side of the base is configured to receive the device under test. The interconnect mechanism also includes a plurality of alignment mechanisms configured to be detachably coupled to the first side of the base. The plurality of alignment mechanisms define an area of the first side of the base to receive the device under test when the plurality of alignment mechanisms are coupled to the first side of the base. Each of the plurality of alignment mechanisms includes an adjustment mechanism for adjusting the area of the first side of the base defined by the plurality of alignment mechanisms.

According to another exemplary embodiment of the present invention, a socket for providing interconnection between an integrated circuit device and a load board of a tester is provided. The socket includes a base defining a plurality of apertures extending therethrough. The base is configured to support an integrated circuit device on a first side of the base. The socket also includes a plurality of alignment mechanisms configured to be detachably coupled to the first side of the base. The plurality of alignment mechanisms have surfaces that collectively define an area of the first side of the base that is configured to support the integrated circuit device. The plurality of alignment mechanisms are configured such that the surfaces defining the area may be moved such that the size of the area changes.

DETAILED DESCRIPTION OF THE INVENTION

Figure 1B:
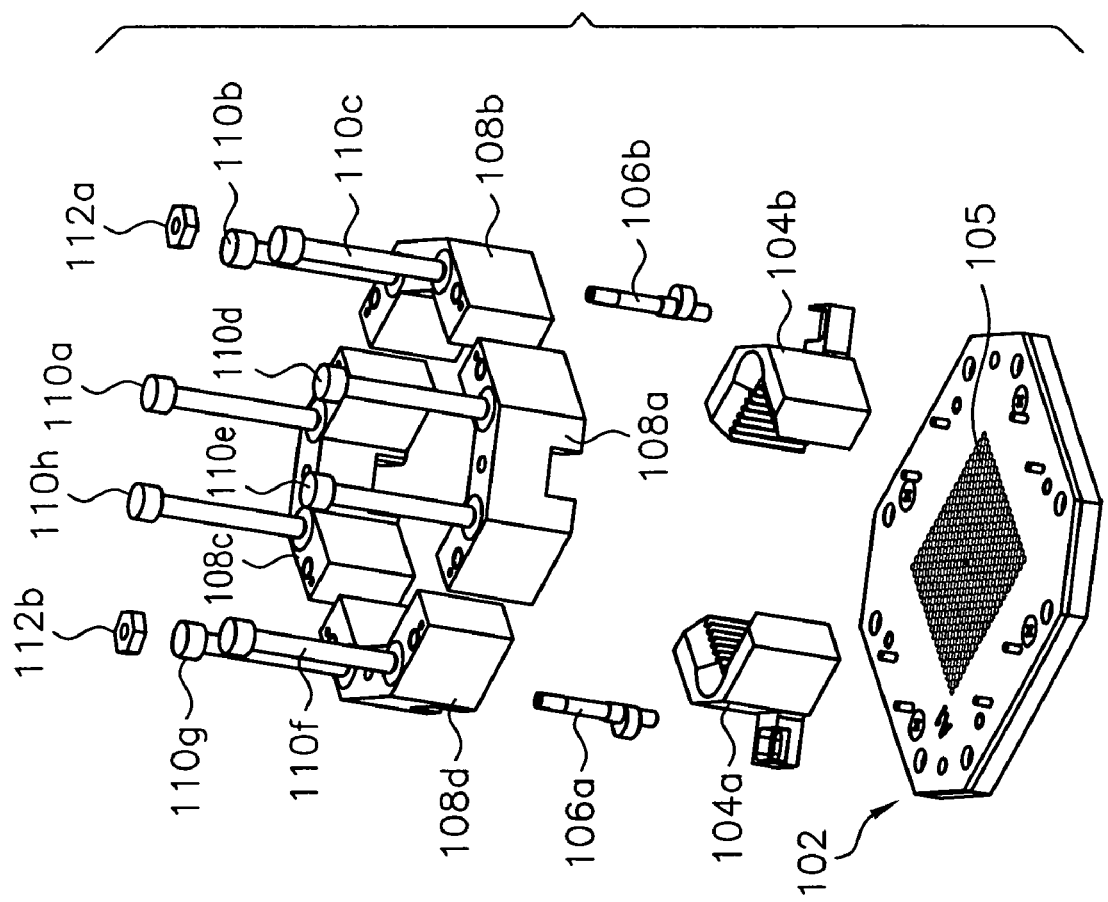
FIG. 1B is an exploded view of the interconnect mechanism of FIG. 1A.

The present invention relates to a packaged IC (i.e., integrated circuit) test vehicle (i.e., an interconnect mechanism) that provides for testing of a wide range of IC platform geometry and/or configurations. According to an exemplary embodiment of the present invention, this is accomplished by using a set of modular building block components as will be explained herein. Such components may be manufactured of, for example, stainless steel, PEEK®, and/or Torlon®. The components may include all mounting, alignment, and electrical contact technology used to test a packaged IC either manually or in an ATE environment.

The present invention provides a test solution for a virtually infinite number of IC configurations. Further, the selection of materials used enables high precision manufacturing at a relatively low cost. Further still, if the device components are properly stored (e.g., vacuum packed), they have virtually infinite shelf life.

Through use of the present invention, the contact design does not rely on 3-4 custom machined components to effect a solution based on the package geometry. The design according to the present invention is "built-up" from building block components that together with the PCB (i.e., printed circuit board) effect a contact solution that is scalable and essentially infinitely configurable.

As compared to prior art solutions, the present invention provides a significant reduction in the design and manufacturing lead times and associated costs. Further, the end-user may test an entire product line (e.g., BGA, LGA, and PGA) with a relatively small number (e.g., 5) of configurable components. Further still, the present invention drives the universalization of test boards.

The packaged IC test vehicle of the present invention (interconnect mechanism) provides for the testing of multiple DUT (i.e., device under test) footprints through the use of a built-in positioning mechanism. Further, the test vehicle may be re-configured to accept DUT footprints in, for example, 2.0 mm increments, without removal from either the load board or the tester. Additionally the test vehicle is adaptable to multiple load boards using modular technology.

Through the present invention, a field adjustable test solution that is applicable to chip-set families is provided. The present invention also results in a substantial reduction in tester set-up times. Further, the present invention significantly lowers the total cost for chip set families by reducing the number of test vehicles required for testing.

According to an exemplary embodiment of the present invention, the test vehicle enables end-users to test entire chip-set ranges with one field adjustable socket; a test that typically requires multiple socket designs. Diagonal positioning corners (e.g., corner cam blocks) are adjusted via a dedicated tool, (e.g., a self-locking cam). The modular design concept enables the test vehicle to be reconfigured to accept larger/smaller chip-set families with a simple pin cartridge (i.e., a base) change.

According to an exemplary embodiment of the present invention, the interconnect mechanism is constructed around a family of 5–10 "shoulder" type spring pins covering BGA, LGA and QFN/QFP applications. The interconnect mechanism is accurately adjustable in the field to cover a range of package size increments common to most chip-set families without removal from the load board.

According to an exemplary embodiment of the present invention, the interconnect mechanism is configured to accommodate metric based designs for greater acceptance in Europe and Asia, in addition to conventional English units.

Figure 1A:
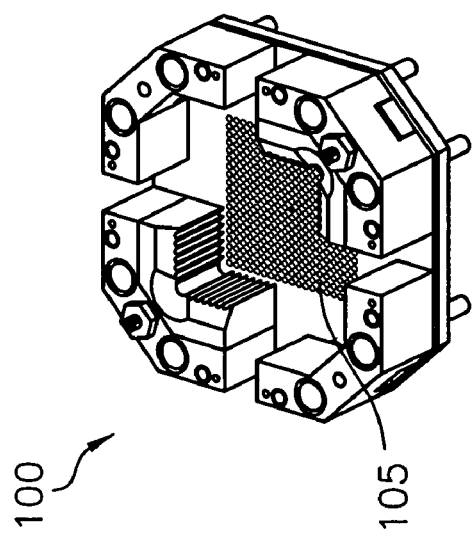
FIG. 1A is a perspective view of an interconnect mechanism in accordance with an exemplary embodiment of the present invention.

FIG. 1A illustrates interconnect mechanism 100 which is configured to provide interconnection between a device under test (e.g., a packaged integrated circuit device) and a tester. For example, interconnect mechanism 100 may be positioned on a printed circuit board (e.g., a load board) used in connection with the tester. The device under test may then be positioned in contact with interconnect mechanism 100 as will be described herein. Force is then applied to the device under test (e.g., force applied by the tester) in order to engage electrical interconnection between electrical contacts on the device under test and interconnection mechanism 100, and between interconnection mechanism 100 and electrical contacts of the tester.

FIG. 1B is an exploded view of interconnect mechanism 100. Interconnect mechanism 100 includes base 102 (i.e., pin cartridge/package 102), corner cam blocks 104a and 104b, adjustment mechanisms 106a and 106b (e.g., cams 106a and 106b), assemblies 108a–108d, fasteners 110a–110h, and nuts 112a and 112b. Generally, corner cam blocks 104a and 104b are detachably coupled to base 102, thereby defining an area of base 102 (i.e., area 105) to which a device under test is engaged for testing. Further, assemblies 108a–108d are detachably coupled to base 102 through fasteners 110a–110h. Further, fasteners 110a–110h (e.g., mounting screws) detachably secure base 102 to the tester (e.g., through a PCB or the like).

Adjustment mechanisms 106a and 106b are engaged with assembly 108d/nut 112b and assembly 108b/nut 112a, respectively. In operation, rotation of nut 112a and/or 112b operates respective adjustment mechanisms 106a and 106b, thereby varying the size of area 105.

Figure 2B:
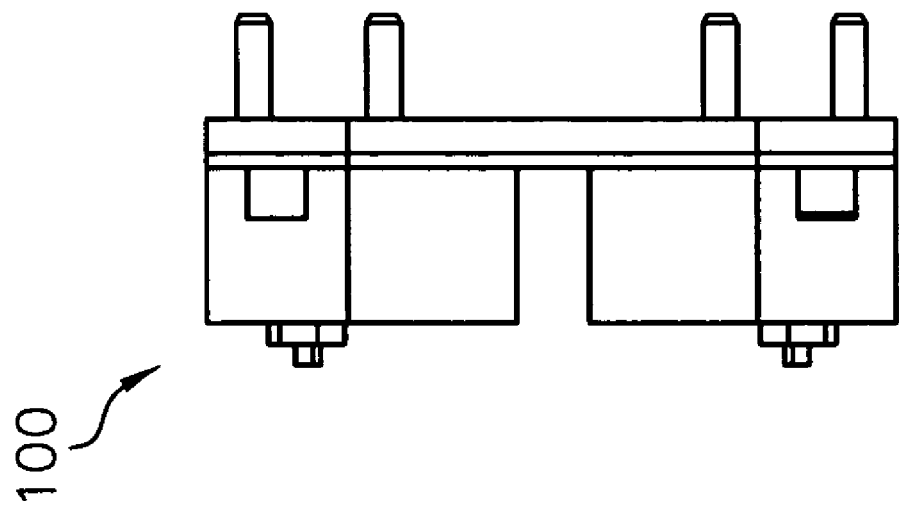
FIG. 2B is a side view of the interconnect mechanism of FIG. 1A.
Figure 2A:
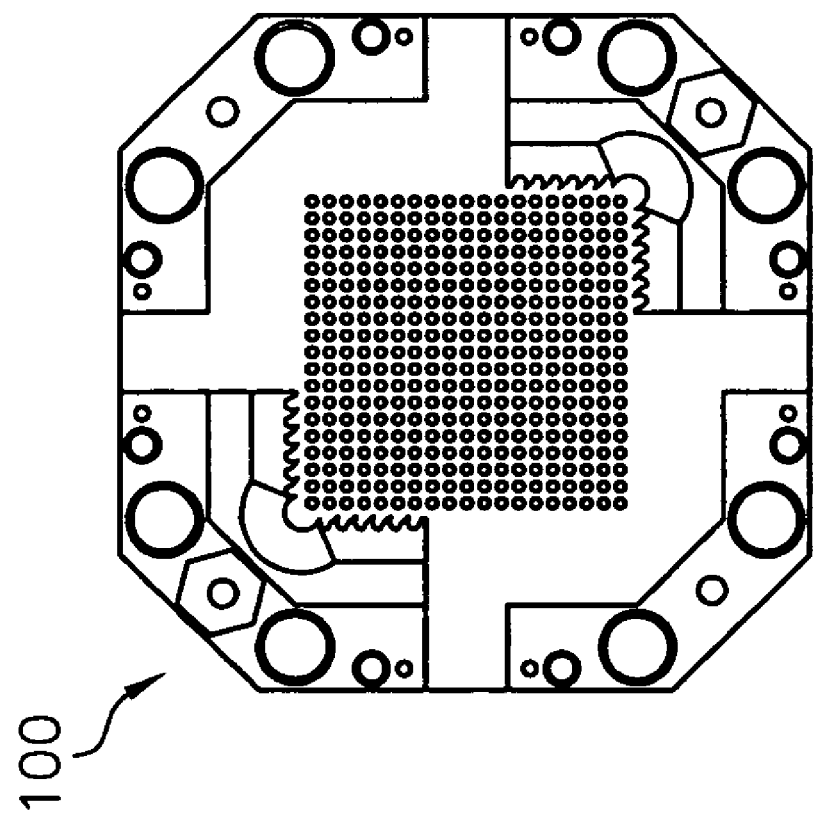
FIG. 2A is a top view of the interconnect mechanism of FIG. 1A.

FIG. 2A is a top view of interconnect mechanism 100, and FIG. 2B is a side view of interconnect mechanism 100.

Figure 3B:
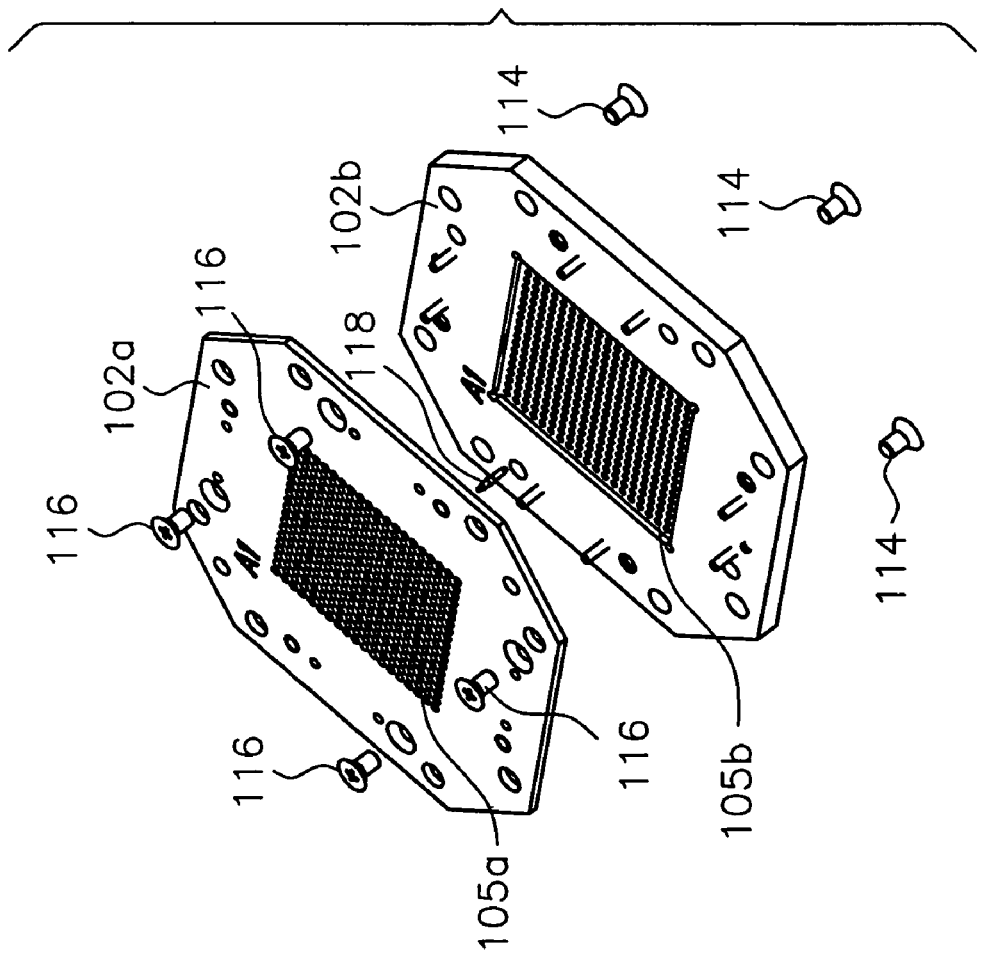
FIG. 3B is an exploded view of the base of FIG. 3A.
Figure 3A:
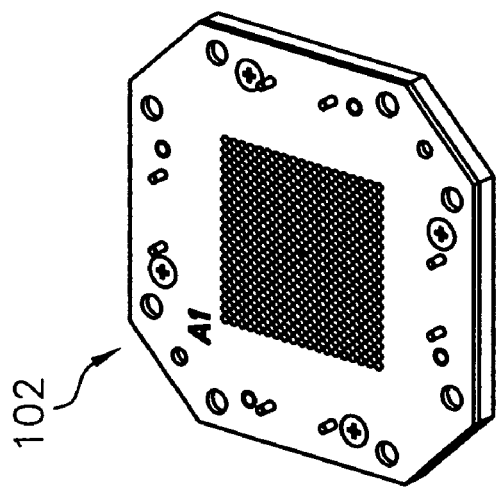
FIG. 3A is a perspective view of a base of the interconnect mechanism of FIG. 1A.

FIG. 3A illustrates base 102 of interconnect mechanism 100. FIG. 3B is an exploded view of base 102. Base 102 includes upper portion 102a and lower portion 102b. For example, upper portion 102a and lower portion 102b may be constructed of a polymeric material (e.g., molded plastic). Each of upper portion 102a and lower portion 102b define a number of apertures in areas 105a and 105b. These apertures allow for electrical interconnection of electrical contacts of a device under test (positioned on one side of base 102) and electrical contacts of a tester (positioned on the other side of base 102). A number of pin elements (e.g., hundreds of pin elements) are positioned between upper portion 102a and lower portion 102b. For clarity, only one such pin element 118 is illustrated in FIG. 3B. Upper portion 102a and lower portion 102b are coupled together using fasteners 116 and 118, as illustrated in FIG. 3B.

In operation, when a force is applied to the device under test (and the device under test is positioned on the base), the force partially transfers to the base, thereby electrically interconnecting electrical contacts of the device under test and the tester with electrical contacts (e.g., pin elements 118) accessible through the apertures defined by the base.

Figure 4B:
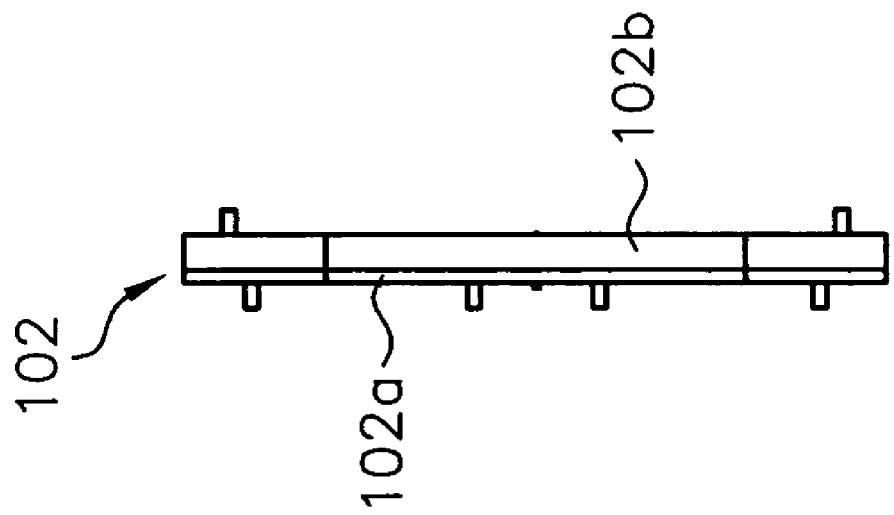
FIG. 4B is a side view of the base of FIG. 3A.
Figure 4A:
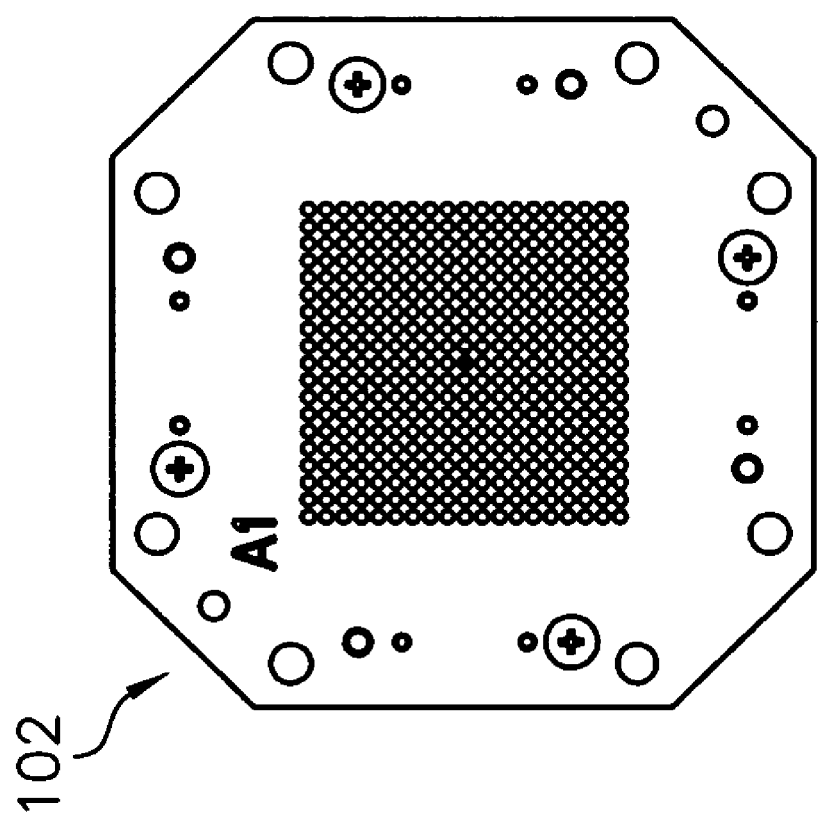
FIG. 4A is a top view of the base of FIG. 3A.

FIG. 4A is a top view of base 102, and FIG. 4B is a side view of base 102. For example, upper portion 102a and lower portion 102b of base 102 may be constructed of PEEK® or PEEK® ESD.

Figure 5:
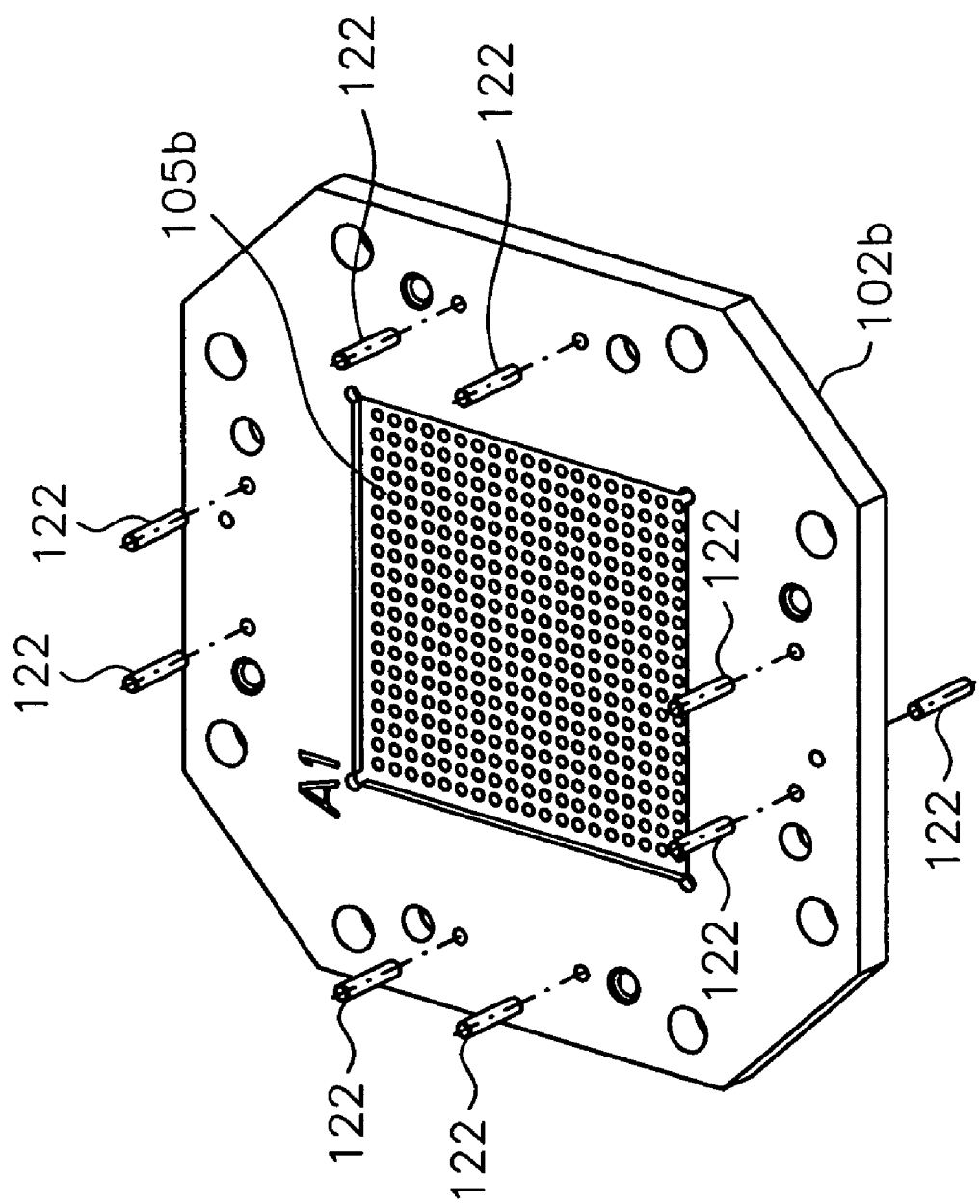
FIG. 5 is a perspective view of a portion of the base of FIG. 3A.

FIG. 5 is a perspective view of lower portion 102b of base 102 which more clearly illustrates the apertures defined in area 105b. Further, a number of alignment pins 122 are illustrated in FIG. 5. Alignment pins 122 are used to align upper portion 102a with 102b through respective holes/apertures defined therein, and may also be used to align assemblies 108a–108d with upper portion 102a through respective holes/apertures defined therein.

Figure 6B:
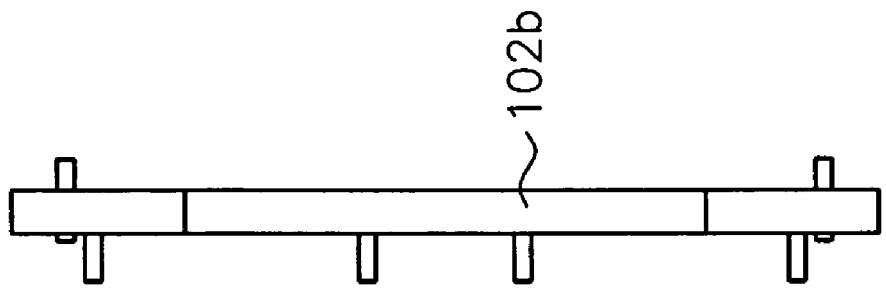
FIG. 6B is a side view of the portion of the base of FIG. 5.
Figure 6A:
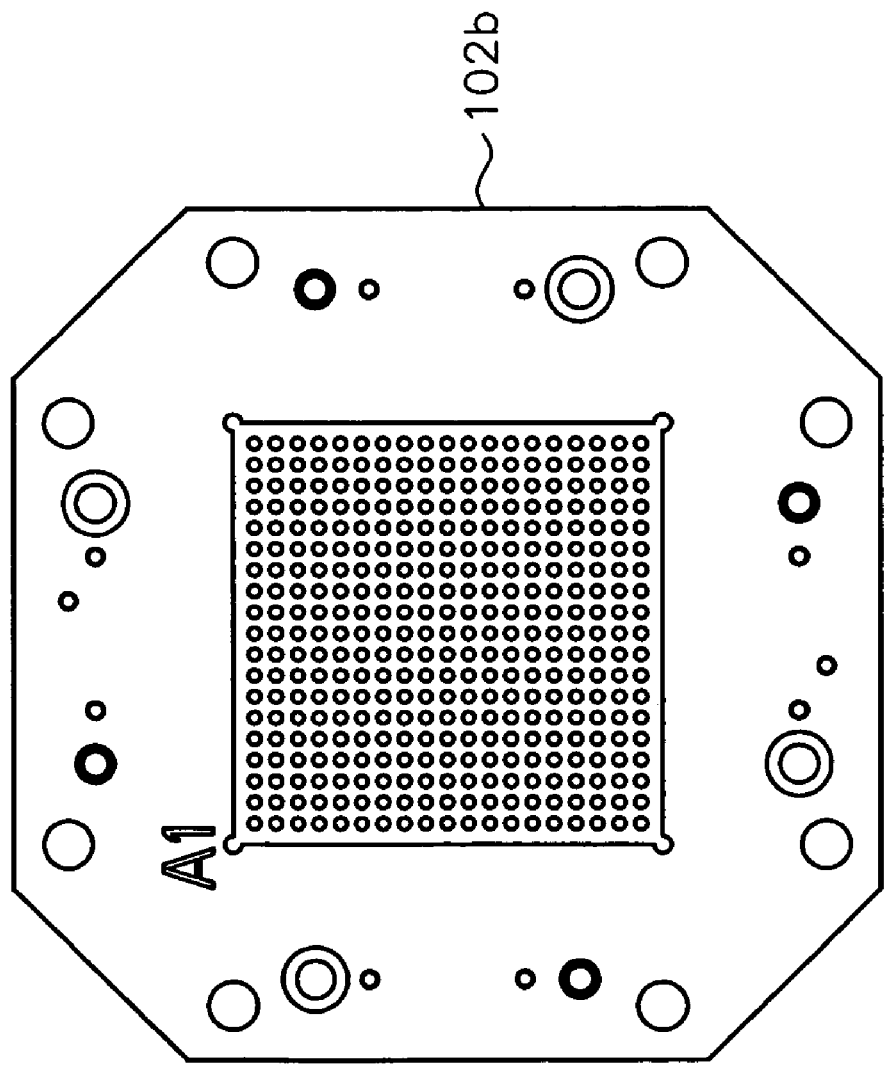
FIG. 6A is a top view of the portion of the base of FIG. 5.

FIG. 6A is a top view of lower portion 102b of base 102, and FIG. 6B is a side view of lower portion 102b of base 102.

Figure 7:
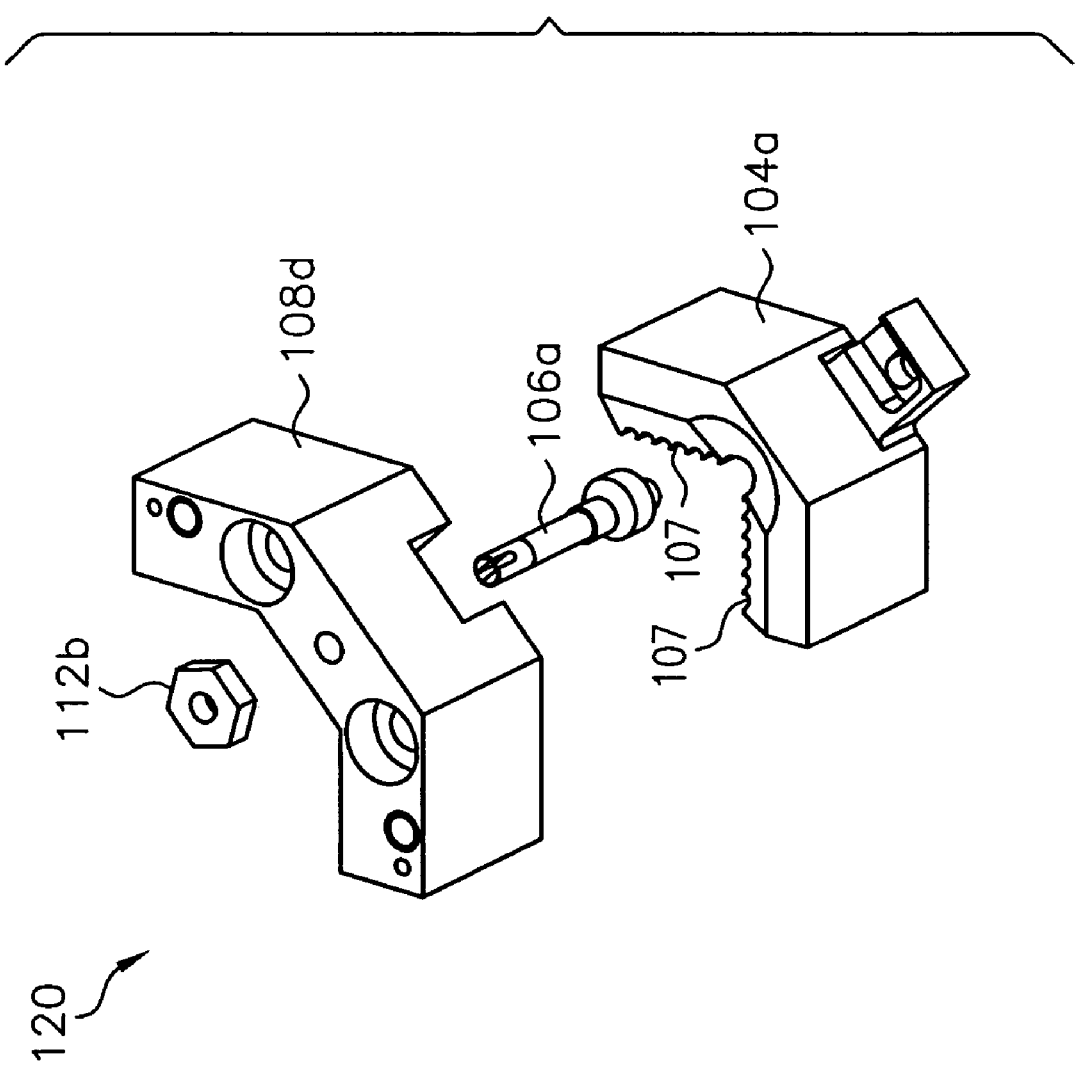
FIG. 7 is an exploded perspective view of a portion of the interconnect mechanism of FIG. 1A.

FIG. 7 is an exploded perspective view of alignment mechanism 120 used in connection with an exemplary embodiment of the present invention. Alignment mechanism 120 is a combination of certain elements illustrated in FIG. 1B including corner cam block 104a, assembly 108d, nut 112b, and adjustment mechanism 106a. Of course, alternative alignment mechanisms are contemplated, so long as they facilitate adjustment of the area configured to receive a semiconductor device to be tested.

As illustrated in FIG. 7, corner cam block 104a includes resilient surfaces 107 for contacting a device under test. Because surfaces 107 are resilient in nature, surfaces 107 are able to contact (and thereby secure in position) devices of a number of varying dimensions. Further, as described above, through the rotation of nut 112b (and the corresponding operation of adjustment mechanism 106a), resilient surfaces 107 may be moved inward or outward, thereby varying area 105 of base 102 which receives a device under test. Thus, a wide range of device sizes may be accommodated. According to an exemplary embodiment of the present invention, operation of a pair of adjustment mechanisms (e.g., adjustment mechanisms 106a and 106b illustrated in FIG. 1B) varies area 105 to accommodate a 2 mm swing in device size (e.g., devices between 18 and 20 mm).

Corner cam blocks 104a and 104b (including resilient surface 107) may be, for example, PEEK® packages. Further, adjustment mechanisms 106a and 106b may be, for example, self-locking cam actuated mechanisms having a predetermined range of motion (e.g., a range of motion 0.053"/180 degrees).

Figure 8A:
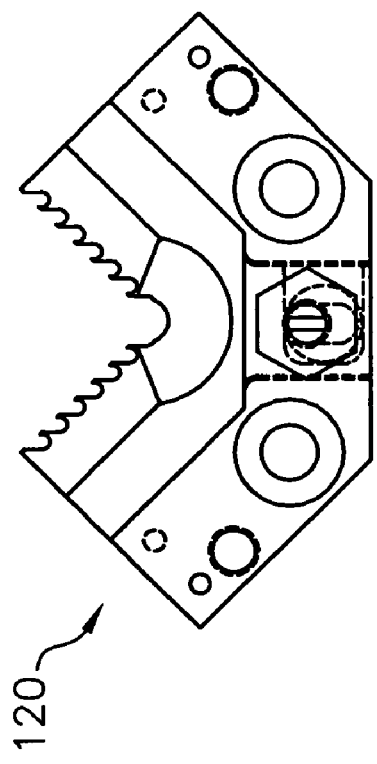
FIG. 8A is a top view of the portion of the interconnect mechanism of FIG. 7.
Figure 8C:
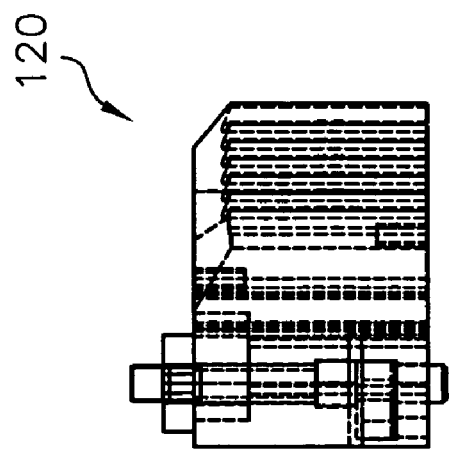
FIG. 8C is a side view of the portion of the interconnect mechanism of FIG. 7.
Figure 8B:
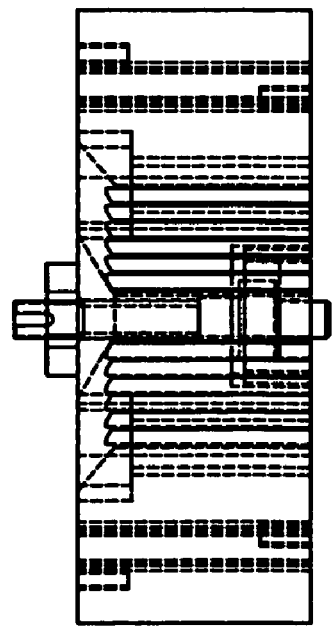
FIG. 8B is a front view of the portion of the interconnect mechanism of FIG. 7.

FIG. 8A is a top view of alignment mechanism 120, FIG. 8B is a front view of alignment mechanism 120, and FIG. 8C is a side view of alignment mechanism 120.

In use, the interconnect mechanism of the present invention overcomes a number of deficiencies of the prior art. For example, a number of different size bases 102 may be used in connection with the other components of interconnect mechanism 100 (i.e., corner cam blocks 104a and 104b, adjustment mechanisms 106a and 106b, assemblies 108a–108d, fasteners 110a–110h, and nuts 112a and 112b). For example, base 102 may be primarily formed of two molded plastic portions (i.e., upper portion 102a and lower portion 102b). A number of different bases may be molded (e.g., bases of different sizes, bases having different aperture configurations, etc.). Each of these bases may be used with the same other components of interconnect mechanism 100 (i.e., corner cam blocks 104a and 104b, adjustment mechanisms 106a and 106b, assemblies 108a–108d, fasteners 110a–110h, and nuts 112a and 112b).

Further, certain of the other components of interconnect mechanism 100 (e.g., corner cam blocks 104a and 104b, and assemblies 108a–108d) may be formed of metal. Because of the strength and rigidity of metal in comparison to certain plastics, these components can be relatively small, which is particularly desirable in the semiconductor industry.

In contrast to the interconnect mechanism of the present invention, certain prior systems hold a device under test in place using molded plastic interfaces that define a "pocket," where the pocket keeps the device under test from rotating or otherwise moving; however, such molded plastic interfaces are relatively large. Further, a different interface is typically used for each device to be tested. The present invention overcomes these deficiencies by providing an interconnect mechanism that includes standard components that may be used with a wide range of devices/packages. Further, if a base does not accommodate a device/package to be tested (e.g., because of the size or the configuration of the device/package), a different base may be used with the remaining components. This substantially reduces lead times because most of the components may be readily available, and even a variety of base units (accommodating packages having varying dimensions and configurations) may be kept in stock by suppliers of such devices.

A benefit provided by the present invention is the distribution of stresses about the body of the socket (including the base), through the interconnect mechanism, with respect to spring pin/electrical contact mechanical load. These loads are typically induced by a hand socket lid during set-up (manual operation of the socket) of the socket. These loads often result in excess deflection of the socket perimeter (contact resistance issues with the array perimeter), mounting hardware failures (inadequate load transfer), and latch/socket interface mechanical failure.

Another benefit provided by the present invention relates to the reduction and/or the substantial elimination of high stress (mechanical) due to spring pin pre-load. These stresses often cause large deflections of the substrate material as well as unacceptable fatigue stress levels at the array perimeter. The present invention addresses such deficiencies through (1) optimization of cartridge substrate thicknesses (base thicknesses), (2) substantial reduction/elimination of counterbores, (3) substantial reduction/elimination of stress concentration factors (i.e. sharp corners, unnecessary tooling marks), and (4) spring pins with relatively low pre-load values.

Yet another benefit provided by the present invention relates to material expansion of machined components due to moisture adsorption. In existing interface devices, machined components "grow" due to adsorption of water vapor entrained in the environment (humidity). The use of alternative materials in the interconnect mechanism of the present invention substantially reduces this problem.

As provided above, yet another benefit provided by the present invention relates to the design for chipset families and a wide range of package tolerances. Typically, several socket designs are provided to accommodate such ranges. The present invention overcomes this deficiency through the use of a field tunable feature incorporated into each adjustment mechanism.

Yet another benefit provided by the present invention relates to accommodating varying package thicknesses through spring biasing.

It is contemplated that the present invention may be provided as a system of universal components (e.g., cam corner blocks, assemblies, adjustment mechanisms, fasteners, nuts, etc.) that may be sold with (or independent of) a specific base/cartridge (where the base contains the interconnect medium). Thus, as provided above, the same set of universal components may be used with a variety of base units, thereby providing improved cost efficiency, improved maintainability, reduced component lead times, and other associated benefits.

Although the present invention has been described primarily in terms of manual/mechanical adjustment mechanisms (e.g., cam mechanisms), it is not limited thereto. For example, such cam mechanisms may be automated. Further, the cam mechanisms may be replaced by, for example, automated mechanisms such as piezo actuators (e.g., piezoelectric actuators) that move a surface of an alignment mechanism to change the area provided for receiving an integrated circuit device. For example, software may be written which, upon providing the identity of the device to be tested (e.g., through a part number, size, etc.) applies a signal to a piezo actuator to move a surface of an alignment mechanism to an appropriate location for the desired integrated circuit device.

Although the invention is illustrated and described herein with reference to specific embodiments, the invention is not intended to be limited to the details shown. Rather, various modifications may be made in the details within the scope and range of equivalents of the claims and without departing from the invention.

What is claimed:

1. An interconnect mechanism for providing electrical interconnection between a device under test and a tester, the interconnect mechanism comprising:
   a base having a first side and a second side, the base defining a plurality of apertures extending from the first side to the second side, the first side being configured to receive the device under test; and
   a plurality of alignment mechanisms configured to be detachably coupled to the first side of the base, the plurality of alignment mechanisms defining an area of the first side of the base to receive the device under test when the plurality of alignment mechanisms are coupled to the first side of the base, wherein at least one of the plurality of alignment mechanisms includes an adjustment mechanism configured to adjust a size of the area of the first side of the base defined by the plurality of alignment mechanisms.

2. The interconnect mechanism of claim 1 additionally comprising a plurality of contact elements, each of the contact elements configured to be received by one of the apertures defined by the base and configured to provide electrical interconnection between a location on the device under test and another location on the tester.

3. The interconnect mechanism of claim 1 wherein the adjustment mechanism includes a cam mechanism for moving a surface of a corresponding one of the alignment mechanisms to adjust the area.

4. The interconnect mechanism of claim 3 wherein the corresponding alignment mechanism includes a cam block having the surface configured to be moved through operation of the cam mechanism.

5. The interconnect mechanism of claim 4 wherein the surface comprises a resilient material.

6. The interconnect mechanism of claim 1 wherein the alignment mechanisms define the area to be a substantially square area, and at least two of the alignment mechanisms include a respective adjustment mechanism for adjusting a size of the substantially square area.

7. The interconnect mechanism of claim 1 wherein the adjustment mechanism is configured to move a resilient surface of a corresponding one of the alignment mechanisms to adjust the area.

8. The interconnect mechanism of claim 1 wherein the adjustment mechanism is configured to adjust the area to accommodate different devices under test having at least one dimension that varies by up to about 2 mm.

9. A socket for providing interconnection between an integrated circuit device and a load board of a tester, the socket comprising:

a base having a first side and a second side, the base defining a plurality of apertures extending from the first side to the second side, the first side being configured to support the integrated circuit device; and a plurality of alignment mechanisms configured to be detachably coupled to the first side of the base, the plurality of alignment mechanisms having surfaces that collectively define an area of the first side of the base that is configured to support the integrated circuit device, the plurality of alignment mechanisms being configured such that the surfaces defining the area are movable such that a size of the area changes.

10. The socket of claim 9 additionally comprising a plurality of contact elements, each of the contact elements configured to be received by one of the apertures defined by the base and to provide electrical interconnection between a location on the integrated circuit device and another location on the load board.

11. The socket of claim 9 additionally comprising adjustment mechanisms for moving the surfaces of the alignment mechanisms to change the area.

12. The socket of claim 11 wherein each of the adjustment mechanisms includes a cam mechanism for moving one of the surfaces.

13. The socket of claim 12 wherein each of the alignment mechanisms includes a cam block defining at least one of the surfaces configured to be moved through operation of the cam mechanism.

14. The socket of claim 9 wherein the surfaces comprise a resilient material.

15. The socket of claim 9 wherein the area is configured to be changed by movement of the surfaces such that the area accommodates different integrated circuit devices having at least one dimension that varies by up to about 2 mm.

* * * * *